United States Patent [19]

Bergemont et al.

[11] Patent Number: 5,496,754
[45] Date of Patent: Mar. 5, 1996

[54] METHOD FOR PREVENTING BIT LINE-TO-BIT LINE LEAKAGE IN THE ACCESS TRANSISTOR REGION OF AN AMG EPROM

[75] Inventors: Albert M. Bergemont, Santa Clara, Calif.; Graham R. Wolstenholme, Boise, Id.

[73] Assignee: National Semiconductor Corporation, Santa Clara, Calif.

[21] Appl. No.: 213,693

[22] Filed: Mar. 15, 1994

[51] Int. Cl.⁶ ............................................. H01L 21/8247
[52] U.S. Cl. ............................................. 437/43; 437/48
[58] Field of Search .............................. 437/43, 48, 52; 257/316

[56] References Cited

U.S. PATENT DOCUMENTS

| 5,204,835 | 4/1993 | Eitan | 365/185 |
| 5,227,326 | 7/1993 | Walker | 437/52 |
| 5,246,874 | 9/1993 | Bergemont | 437/52 |
| 5,346,842 | 9/1994 | Bergemont | 437/52 |
| 5,371,030 | 12/1994 | Bergemont | 437/52 |

FOREIGN PATENT DOCUMENTS 0573168  12/1993  European Pat. Off. .

Primary Examiner—George Fourson
Assistant Examiner—Richard A. Booth
Attorney, Agent, or Firm—Limbach & Limbach

[57] ABSTRACT

The bit lines in an alternate-metal, virtual-ground (AMG) electrically programmable read-only-memory (EPROM), are formed by utilizing a plurality of field oxide regions and a plurality of pairs of dielectric/floating gate strips, which have the ends of each pair of strips connected together over a field oxide region, as an implant mask. By connecting together the ends of each pair of dielectric/floating gate strips, the width of the strips at the edges of the field oxide regions will remain constant. As a result, the isolation between adjacent bit lines, which is defined by the width of the strips, will also remain constant.

13 Claims, 14 Drawing Sheets 5,496,754

METHOD FOR PREVENTING BIT LINE-TO-BIT LINE LEAKAGE IN THE ACCESS TRANSISTOR REGION OF AN AMG EPROM

BACKGROUND OF THE INVENTION

1. Field of the Invention

The present invention relates to an alternate-metal, virtual-ground (AMG) electrically-programmable read-only-memory (EPROM) and, in particular, to a method for preventing bit line-to-bit line leakage in the access transistor region of an AMG EPROM.

2. Discussion of the Related Art

An alternate-metal, virtual-ground (AMG) electrically-programmable read-only-memory (EPROM) is a non-volatile memory that, like conventional EPROMs and electrically-erasable programmable read-only-memories (EEPROMs), retains data which has been stored in the memory when power is removed and which, unlike conventional EPROMs and EEPROMs, uses a series of access transistors to contact the source bit lines of the array.

FIG. 1 shows a plan view that illustrates a portion of a conventional AMG EPROM array 10. As shown in FIG. 1, array 10 includes a series of memory cells 12, a series of access transistors 14, a series of metal bit line contacts MBL1-MBLn, and a series of field oxide regions FOX which isolate the access transistors 14 and metal bit line contacts MBL1-MBLn in the array.

In addition, the memory cells 12 in a row of memory cells share a common word line 16. As is well known, the portion of the word line 16 which is formed over each memory cell 12 in a row of memory cells functions as the control gate of the memory cells in that row. Similarly, the access transistors 14 in a row of access transistors share a common access select line 18.

As also shown in FIG. 1, each memory cell 12 and each access transistor 14 in a column of memory cells and access transistors share a source bit line SOURCE and a drain bit line DRAIN with the remaining memory cells and access transistors in the column, and with the memory cells 12 and access transistors 14 in the horizontally-adjacent columns. In a conventional AMG EPROM, the metal bit lines typically contact the drain bit lines DRAIN once every $2^x$ cells (e.g., 32 or 64 cells) while, on the other hand, the source bit lines SOURCE are not contacted by a metal bit line.

During the fabrication process of an AMG EPROM, the drain and source bit lines DRAIN and SOURCE can be formed by utilizing a plurality of spaced-apart, parallel, dielectric/floating gate strips as an implant mask. As a result, the isolation between adjacent bit lines may be defined by the width of the dielectric/floating gate strips.

FIGS. 2A–2C show cross-sectional diagrams taken along lines 1A—1A, 1B—1B, and 1C—1C, respectively, that illustrate the formation of a plurality of dielectric/floating gate strips 20. As shown in FIGS. 2A–2C, the dielectric/floating gate strips 20 are initially formed by growing a layer of gate oxide 24 on a semiconductor substrate 22 which has a plurality of previously formed field oxide regions FOX.

Next, a layer of polysilicon (poly1) 26 is deposited over the layer of gate oxide 24 and the field oxide regions FOX, and then doped in a conventional manner. As is well known, the floating gates will be formed from the layer of poly1 26. After the layer of poly1 26 has been deposited, a layer of oxide-nitride-oxide (ONO) 28 is formed over the layer of poly1 26.

Following this, a photoresist mask 30 is formed and patterned to define a series of mask strips on the layer of ONO 28. FIG. 3 shows a plan view that illustrates a pair of mask strips 32 formed over the layer of ONO 28. As shown in FIG. 3, the ends of the strips 32 are formed over the edges of a field oxide region FOX, which also functions as an implant mask.

Once mask 30 has been formed, the unmasked layer of ONO 28 and the underlying layer of poly1 26 are then etched to form the dielectric/floating gate strips 20 from the composite layers of ONO 28 and poly1 26. The strips 20 and the field oxide regions FOX are then used as a self-aligned mask during an arsenic implant which defines the N+ bit lines 34 of the array.

FIGS. 4A and 4B show plan views that illustrate the structure that results after the formation of the bit lines 34. As shown in FIG. 4A, both the dielectric/floating gate strips 20 and the field oxide regions FOX are conventionally depicted as having square corners. In actual practice, however, as shown in FIG. 4B, both the resulting dielectric/floating gate strips 20 and the field oxide regions FOX have rounded corners.

One problem with utilizing the dielectric/floating gate strips 20 and the field oxide regions FOX as an implant mask is that, if mask 30 is slightly misaligned, the misalignment can cause the ends of the strips 20 to be only partially formed over the edges of the field oxide regions FOX. FIG. 5 shows a plan view that illustrates the structure that results after the formation of the bit lines 34 when mask 30 is slightly misaligned.

As shown in FIG. 5, when mask 30 is slightly misaligned, the width of the strips 20 at the edges of the field oxide regions FOX can be substantially reduced. As a result, the bit line-to-bit line isolation may also be substantially reduced. As the isolation between adjacent bit lines is reduced, the probability of bit line-to-bit line leakage increases.

Therefore, there is a need for a method that assures that the width of the dielectric/floating gate strips will be completely formed over the edges of the field oxide regions even when the mask that defines the dielectric/floating gate strips is misaligned, thereby insuring that the bit line-to-bit line isolation will remain constant.

SUMMARY OF THE INVENTION

The process of the present invention assures that the width of the strips are completely formed over the edges of the field oxide regions by modifying the mask that defines the dielectric/floating gate strips so that the ends of each pair of strips are connected together over a single field oxide region. As a result, even if the mask which defines the dielectric/floating gate strips is slightly misaligned, the width of the strips at the edge of the field oxide regions will remain constant.

In accordance with the present invention, a method of fabricating an alternate-metal, virtual-ground electrically programmable read-only-memory (EPROM) begins by providing a P-type semiconductor substrate which has an access select region and an array region. Following this, a plurality of spaced-apart contact-isolation field oxide regions and a plurality of spaced-apart transistor-isolation field oxide regions are formed in the access select region of the semiconductor substrate. Next, the semiconductor substrate is implanted in the access select region and the array region with a P-type dopant to set a channel threshold voltage. A layer of first dielectric material is then formed over the semiconductor substrate in the access select region and the array region. After the layer of first dielectric material has been formed, a layer of conductive material is formed over the layer of first dielectric material, the contact-isolation field oxide regions, and the transistor-isolation field oxide regions in the access select region, and over the layer of first dielectric material in the array region. Next, a layer of second dielectric material is formed over the layer of conductive material in the access select region and the array region. Once the layer of second dielectric material has been formed, a plurality of unmasked, spaced-apart parallel strips, and a plurality of pairs of masked, spaced-apart parallel strips are defined on the layer of second dielectric material. Each pair of masked strips has ends which are connected together over a contact-isolation field oxide region. Following this, the unmasked strips of second dielectric material and the layer of conductive material underlying the unmasked strips of second dielectric material are etched away to form a plurality of pairs of spaced-apart parallel strips of second dielectric material and underlying conductive material.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 6–15 show plan and cross-sectional views that illustrate the process for forming an alternate-metal, virtual-ground (AMG) electrically programmable read-only memory (EPROM) in accordance with the present invention. The process of the present invention, which will be described with respect to a 0.6 micron photolithographic process, begins with the provision of a semiconductor substrate of P-type conductivity. As is well known, the substrate of an AMG EPROM includes a plurality of access select regions, where the to-be-formed access select transistors and metal bit line contacts will be formed, and a plurality of array regions, where the to-be-formed memory cells will be formed.

Figure 1:
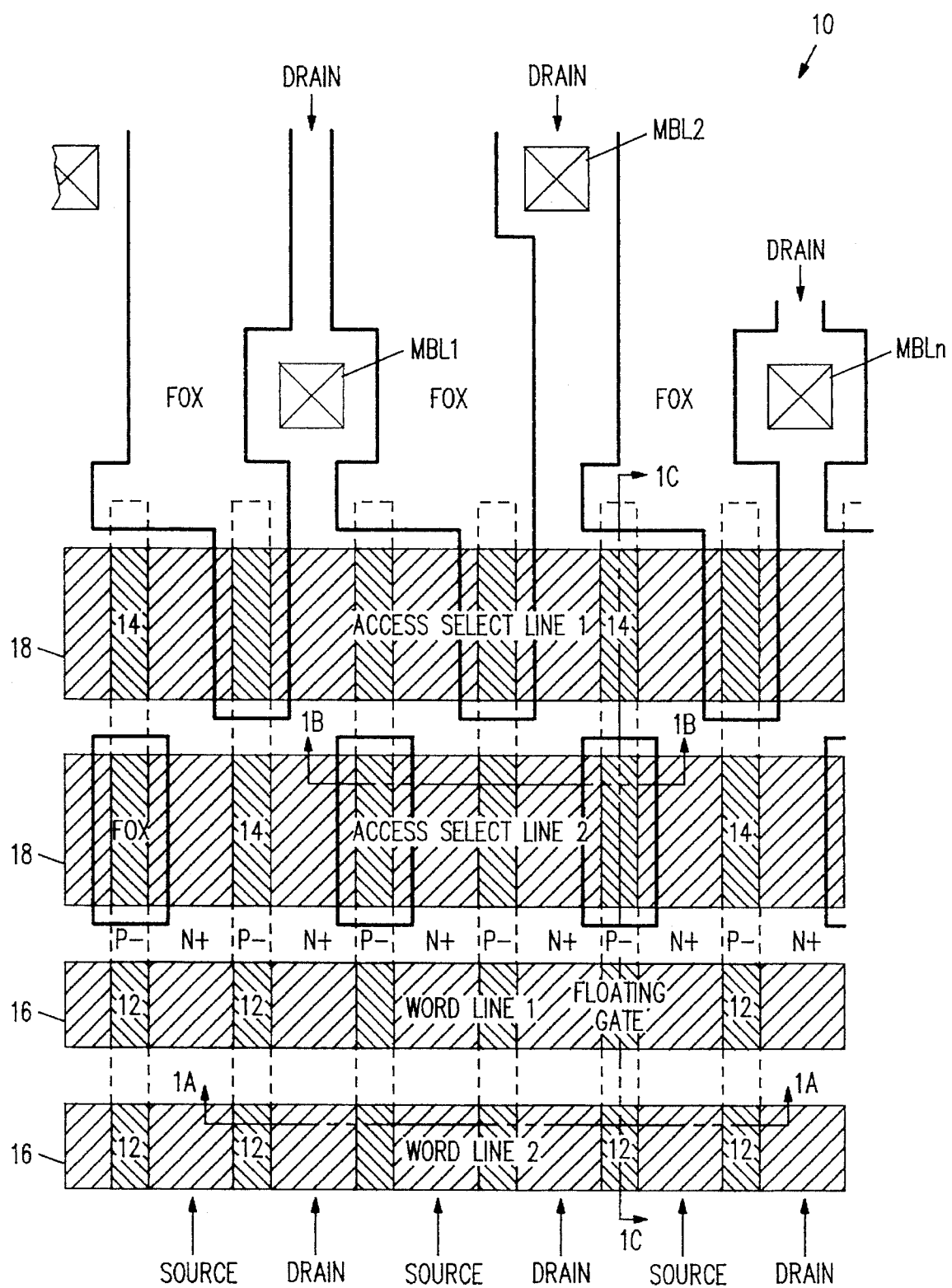
FIG. 1 is a plan view illustrating a portion of a conventional AMG EPROM array 10.
Figure 2A:
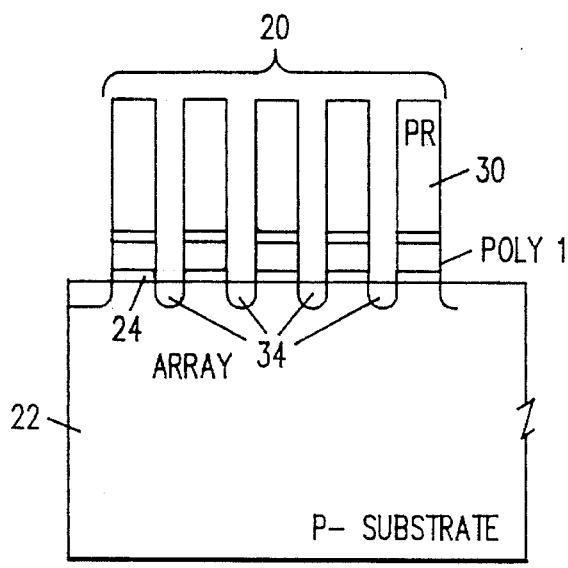
FIGS. 2A–2C are cross-sectional diagrams taken along lines 1A—1A, 1B—1B, and 1C—1C, respectively, illustrating the formation of a plurality of dielectric/floating gate strips 20.
Figure 2B:
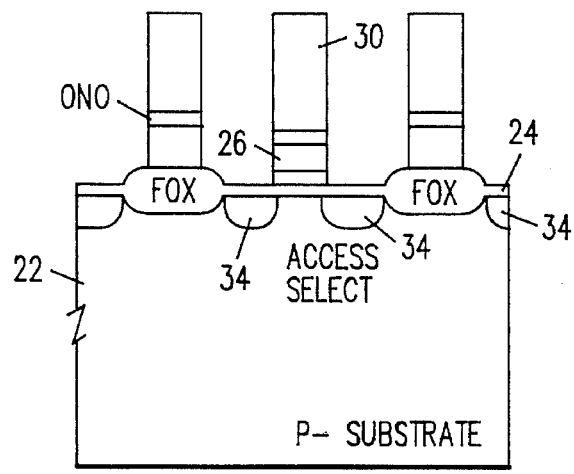
Figure 2C:
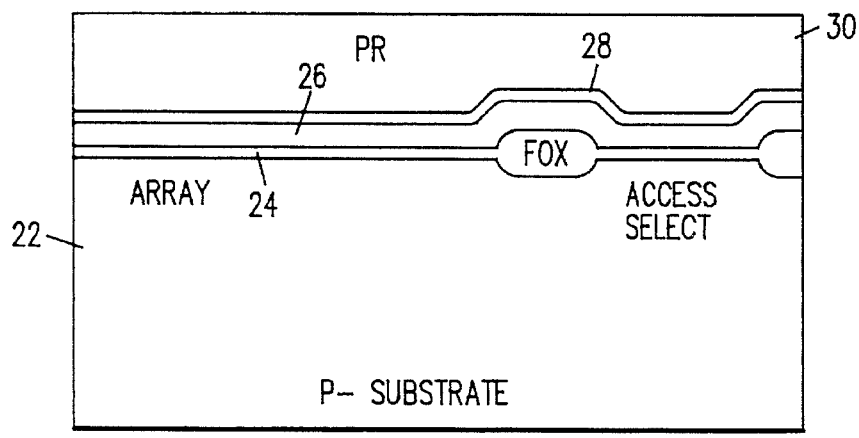
Figure 3:
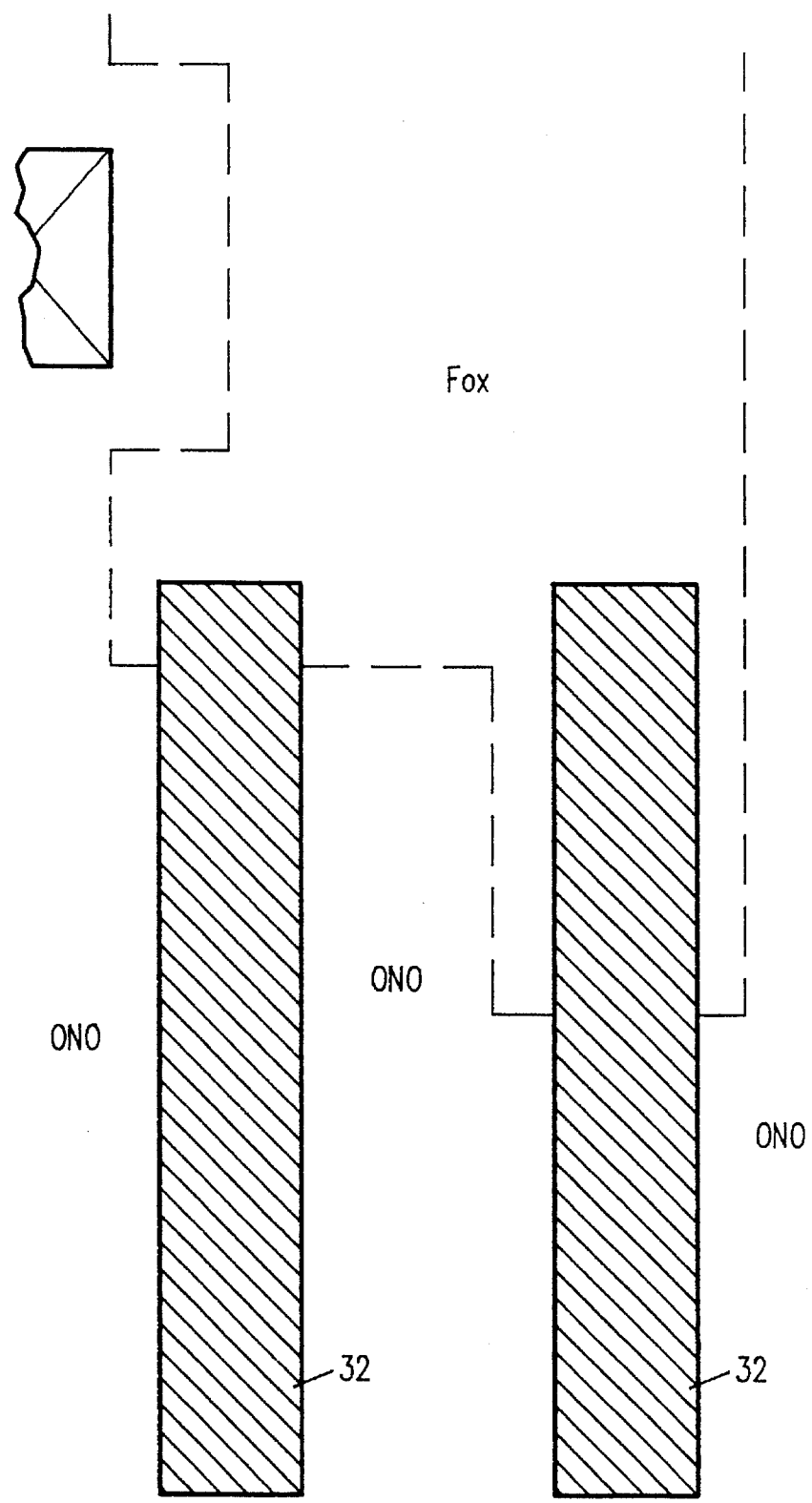
FIG. 3 is a plan view illustrating a pair of mask strips 32 formed over the layer of ONO 28.
Figure 4A:
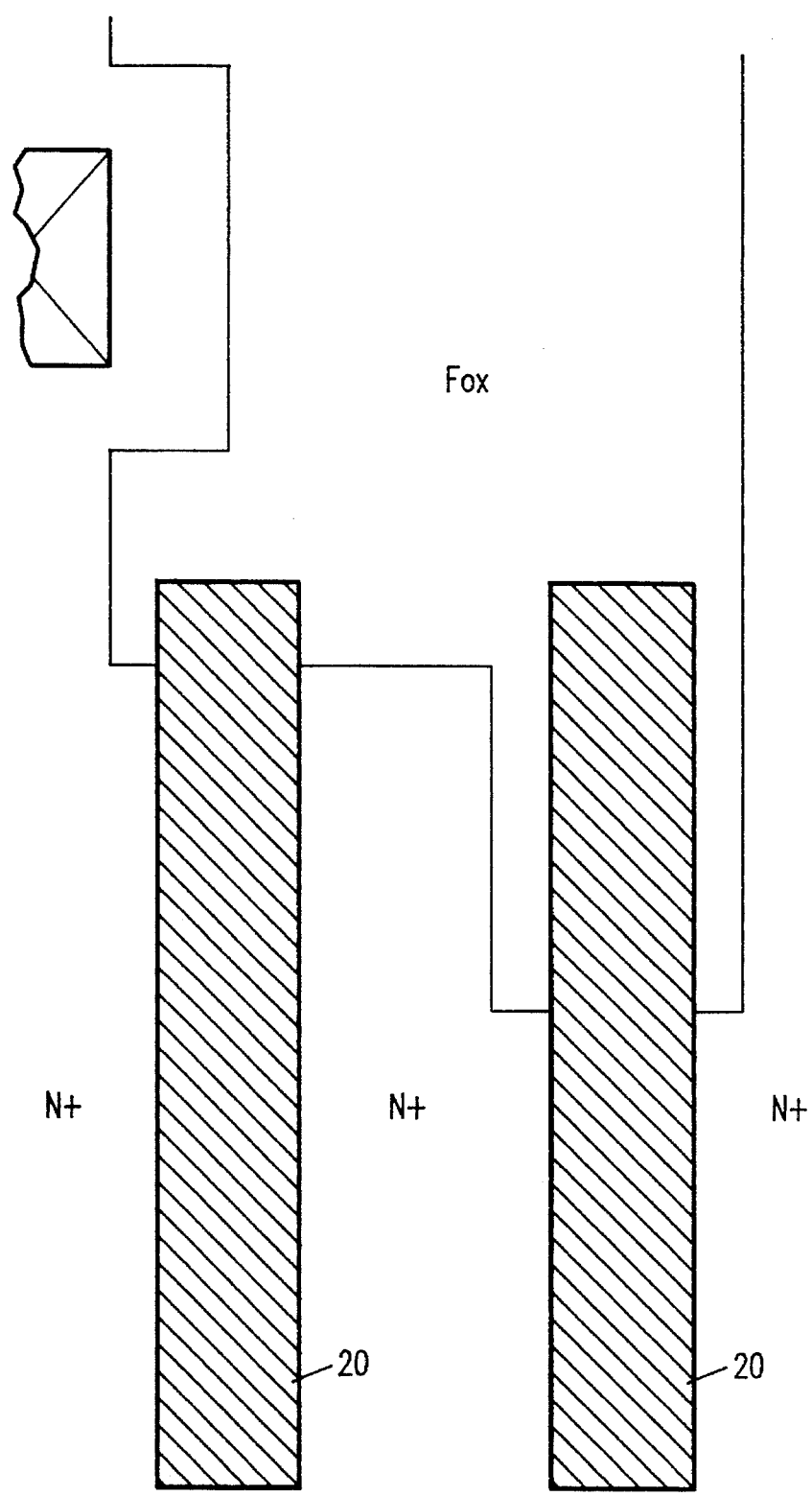
FIGS. 4A and 4B are plan views illustrating the structure that results after the formation of the bit lines 34.
Figure 4B:
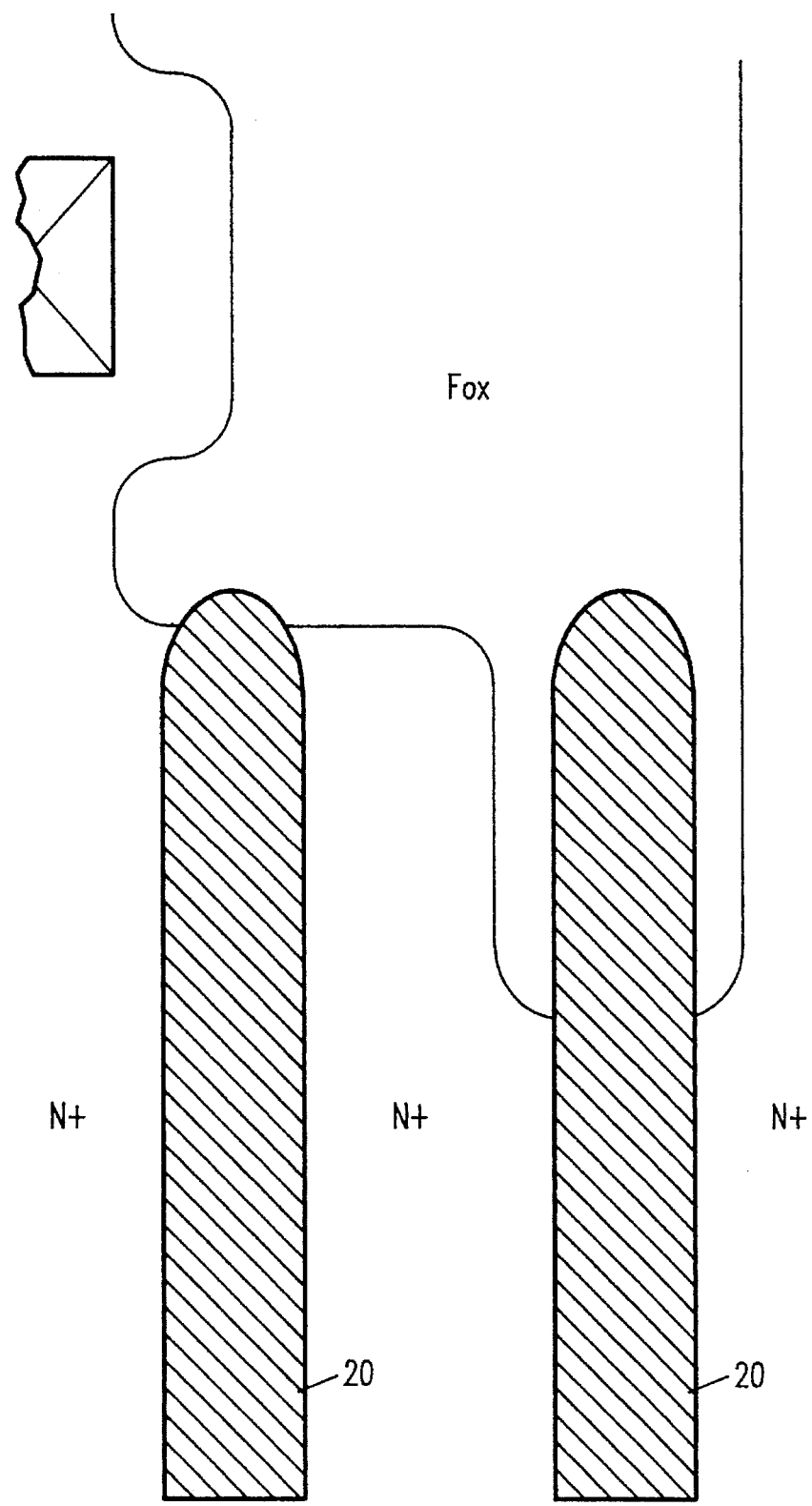
Figure 5:
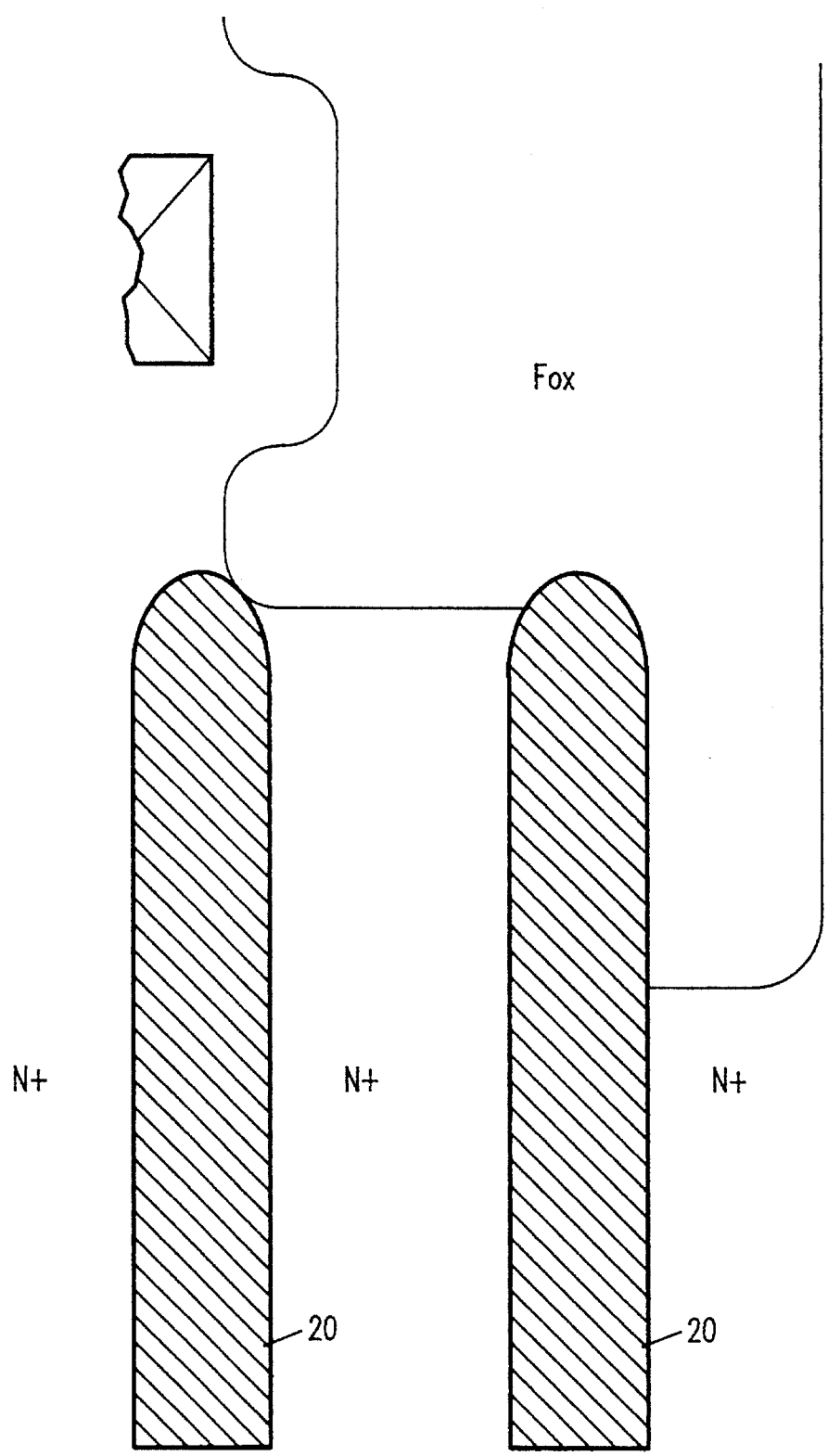
FIG. 5 is a plan view illustrating the structure that results after the formation of the bit lines 34 when mask 30 is slightly misaligned.
Figure 6:
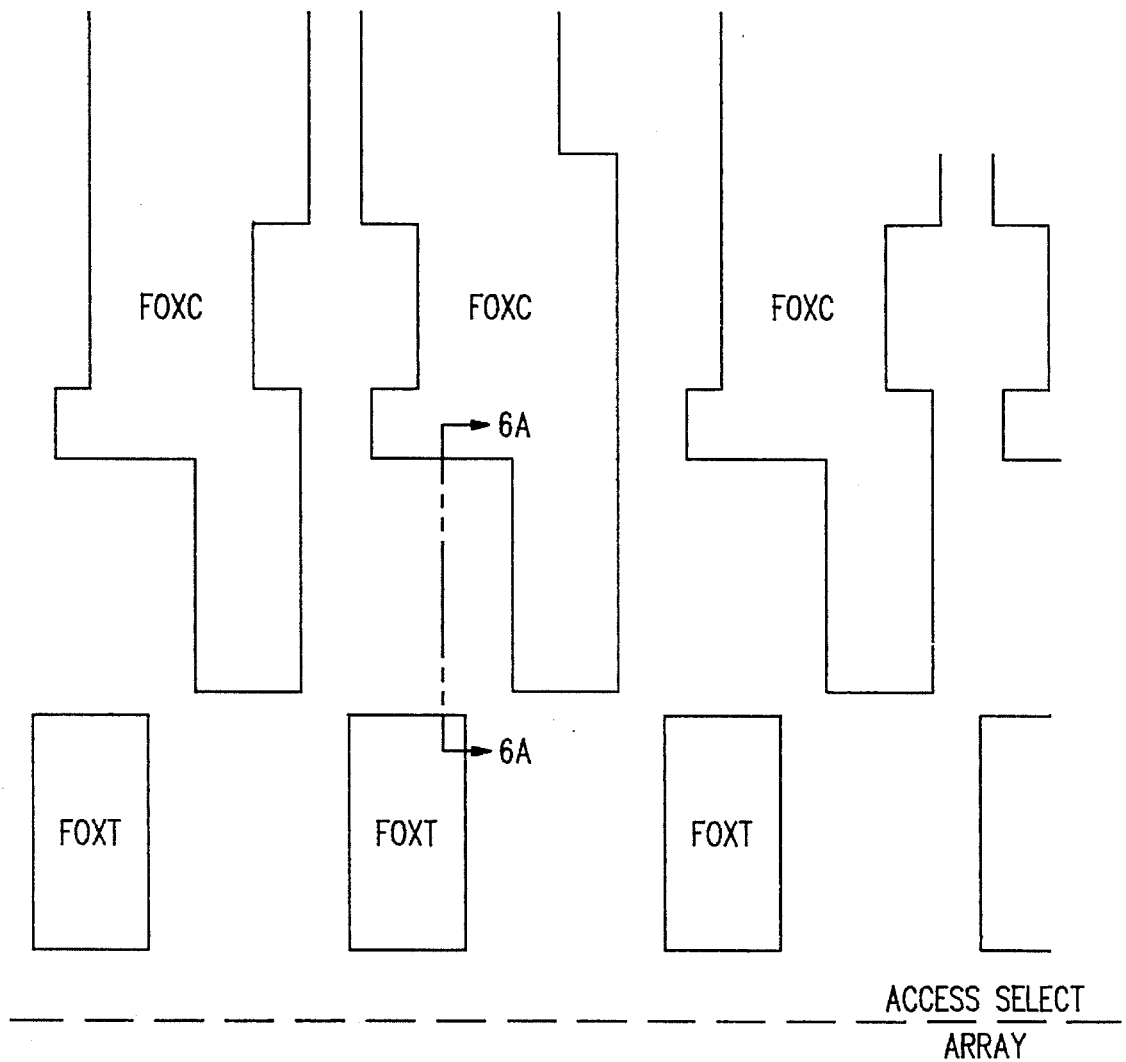
FIG. 6 is a plan view illustrating the formation of the field oxide regions in a P-type semiconductor substrate 100.
Figure 7:
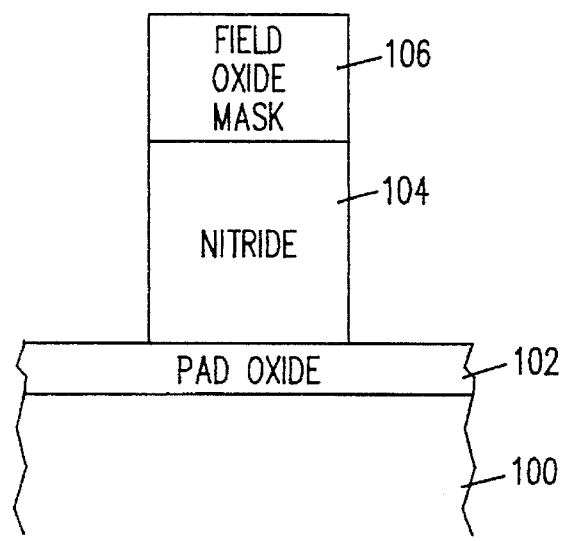
FIGS. 7 and 8 are cross-sectional diagrams taken along lines 6A—6A.
Figure 8:
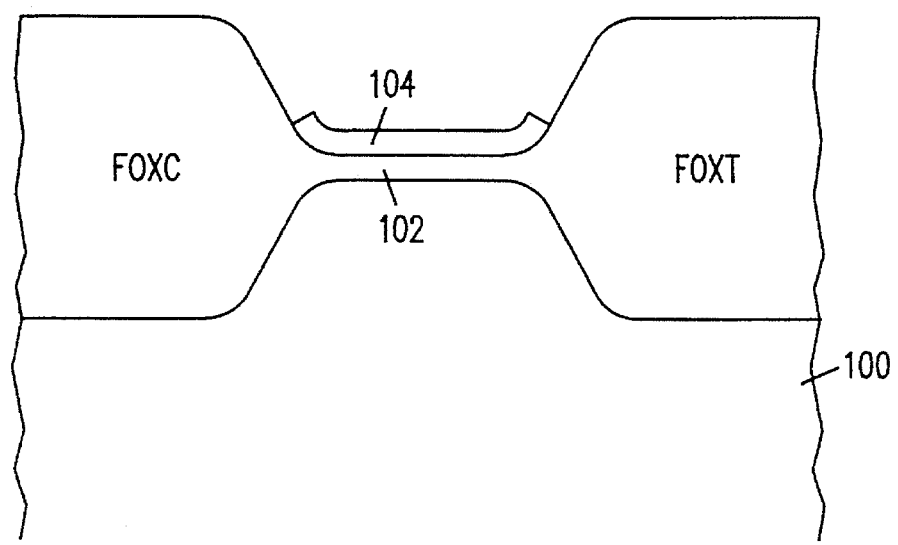

Following this, the next step is the formation of a plurality of field oxide regions in the access select regions of the semiconductor substrate. FIG. 6 shows a plan view that illustrates the formation of the field oxide regions in a P-type semiconductor substrate 100. FIGS. 7 and 8 show cross-sectional diagrams taken along lines 6A—6A.

As shown in FIG. 7, the field oxide regions are first formed by growing a layer of pad oxide 102 approximately 500 Å thick over substrate 100. This is followed by the deposition of an overlying layer of nitride 104 approximately 2,000 Å thick. Next, a field oxide mask 106 is formed over the nitride/pad oxide composite and patterned to define the field oxide regions.

Following this, the unmasked areas are etched until the underlying layer of nitride 104 is removed. As a result of this etching step, a plurality of pad oxide regions are exposed. After the unmasked layer of nitride 104 has been removed, the field oxide mask is stripped. Following this, a P-field implant mask is formed and patterned to protect portions of the periphery. The unmasked regions of pad oxide regions are implanted with $BF_2$ at 50 KeV to form implant regions which have an implant concentration of approximately $4\times 10^{13}/cm^2$.

Referring to FIG. 8, after the pad oxide regions have been implanted, the resulting device is oxidized until a plurality of contact-isolation field oxide regions FOXC and a plurality of transistor-isolation field oxide regions FOXT have been grown. The contact-isolation field oxide regions FOXC are utilized to isolate the to-be-formed metal bit line contacts and the to-be-formed access transistors in the first row of access transistors, while the transistor-isolation field oxide regions FOXT are utilized to isolate the to-be-formed access transistors in the second row of access transistors. The fabrication steps utilized to form the field oxide regions FOXC and FOXT are conventional and well known in the art.

Once the field oxide regions FOXC and FOXT have been formed, the next step is to set the channel threshold voltages for the to-be-formed memory cells. The threshold voltages are set by first removing the nitride/pad oxide composite layer. Next, a layer of sacrificial oxide (not shown) is grown on the exposed substrate 100. Following this, a threshold voltage mask is formed over the layer of sacrificial oxide and patterned to protect the periphery.

After the threshold voltage mask has been formed and patterned, the semiconductor substrate 100 underlying the unmasked areas of sacrificial oxide is implanted with $B_{11}$ at 40 KeV to form an implant concentration of approximately $5\times 10^{12}/cm^2$. Following this, the threshold voltage mask is stripped and the layer of sacrificial oxide is removed. The fabrication steps utilized to set the channel threshold voltages are also conventional and well known in the art.

Figure 9:
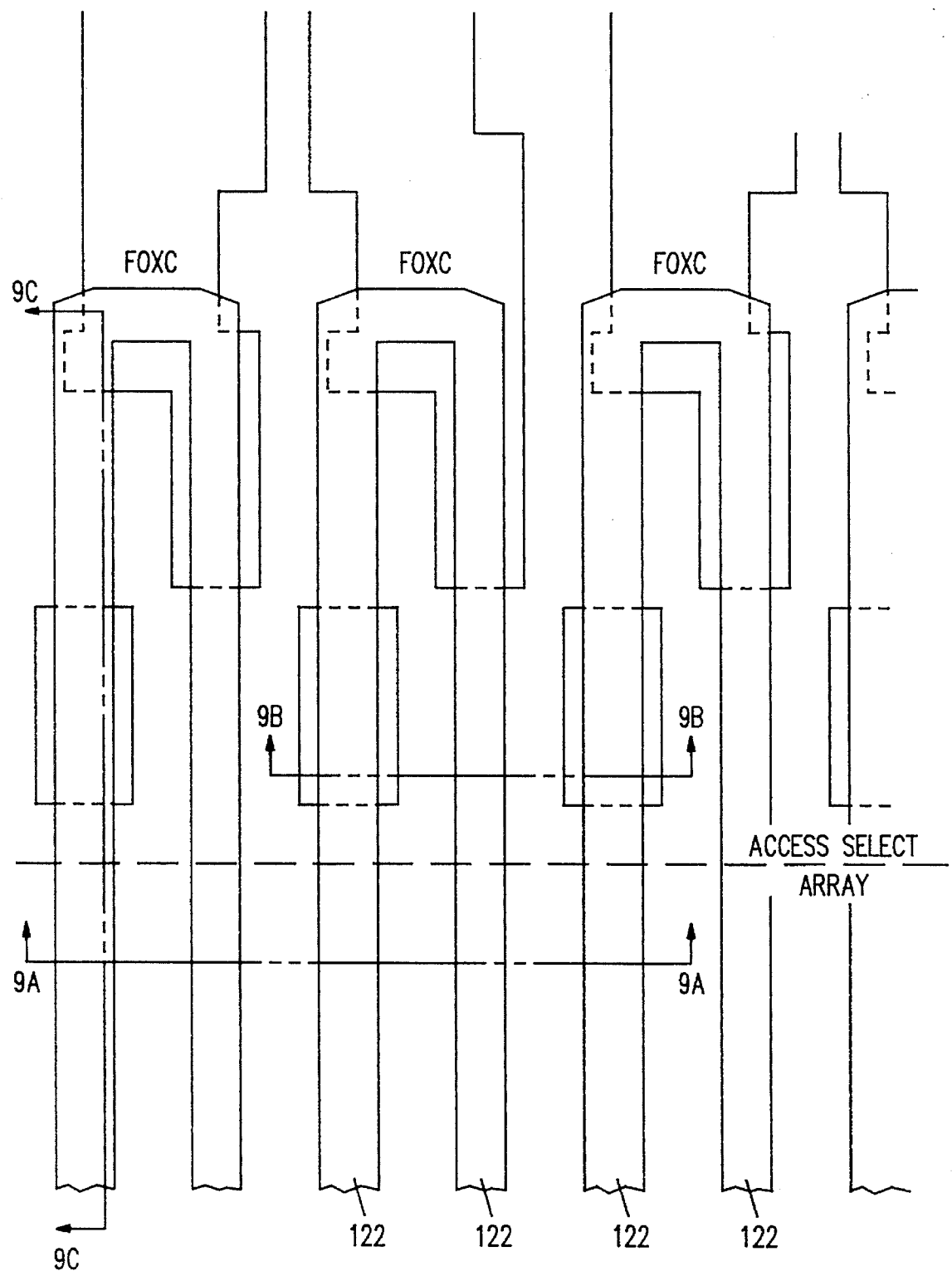
FIG. 9 is a plan view illustrating the initial formation of the floating gates.
Figure 10A:
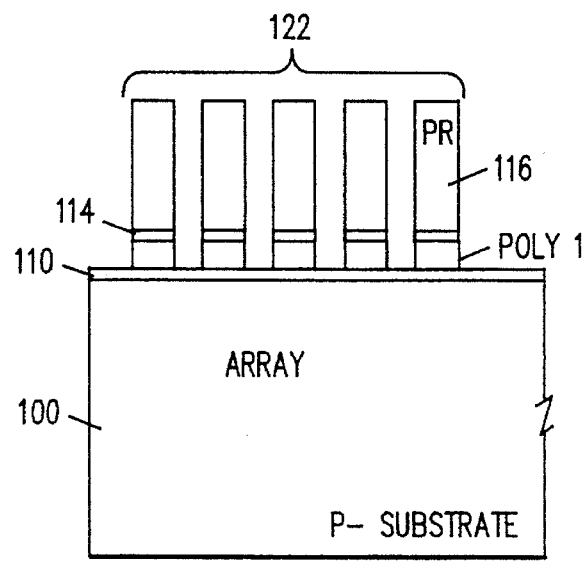
FIGS. 10A–10C are cross-sectional diagrams taken along lines 9A—9A, 9B—9B, and 9C—9C, respectively.
Figure 10B:
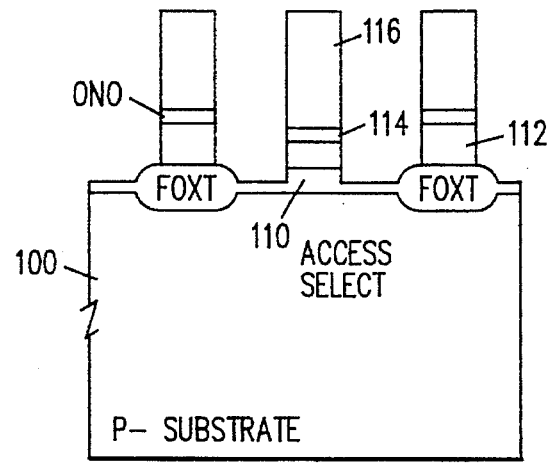
Figure 10C:
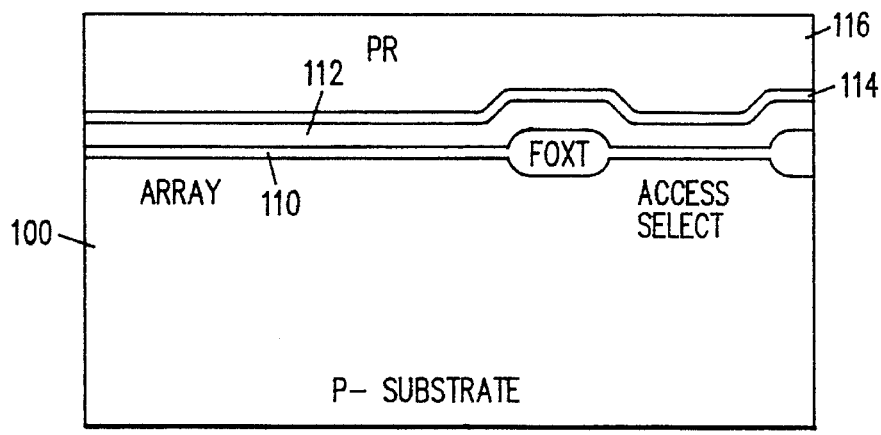

After the layer of sacrificial oxide has been removed, the next step is the initial formation of the floating gates of the memory cells and access transistors. FIG. 9 shows a plan view that illustrates the initial formation of the floating gates. FIGS. 10A–10C show cross-sectional diagrams taken along lines 9A—9A, 9B—9B, and 9C—9C, respectively.

As shown in FIGS. 10A–10C, the floating gates are first formed by growing a layer of gate oxide 110 approximately 150–200 Å thick on substrate 100. Next, a layer of polysilicon (poly1) 112 approximately 1,500 Å thick is deposited over the layer of gate oxide 110 and the field oxide regions FOXC and FOXT. The layer of poly1 112 is then doped in a conventional manner. As is well known, the floating gates of the array are formed from the layer of poly1 112.

Next, as further shown in FIGS. 10A–10C, a composite dielectric layer of oxide/nitride/oxide (ONO) 114 is formed on the layer of poly1 112. Following this, a photoresist mask 116 is formed over the layer of ONO 114 and patterned to define a plurality of pairs of masked, spaced-apart parallel strips on the layer of ONO 114. As a result, a plurality of unmasked, spaced-apart parallel strips are also formed between the masked strips.

Figure 11:
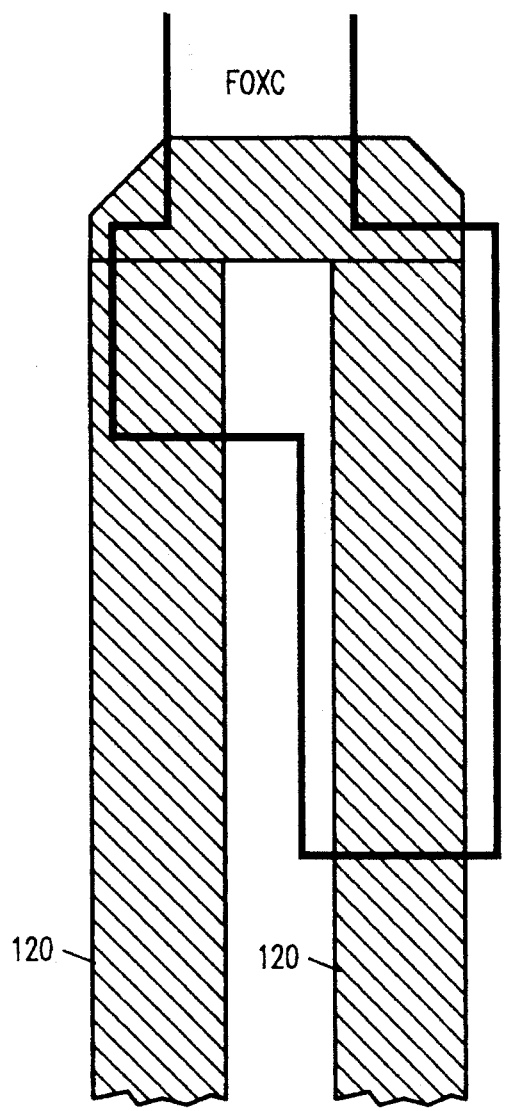
FIG. 11 is a plan diagram illustrating the formation of a pair of masked strips 120 over one field oxide region FOXC.

FIG. 11 shows a plan diagram that illustrates the formation of a pair of masked strips 120 over one field oxide region FOXC. As shown in FIG. 11, in accordance with the present invention, the ends of the masked strips 120 are connected together over the field oxide region FOXC. Alternately, photoresist mask 116 can be formed so that the ends of each pair of masked strips 120 have an angled portion which is formed over a contact-isolation field oxide region FOXC.

Figure 12:
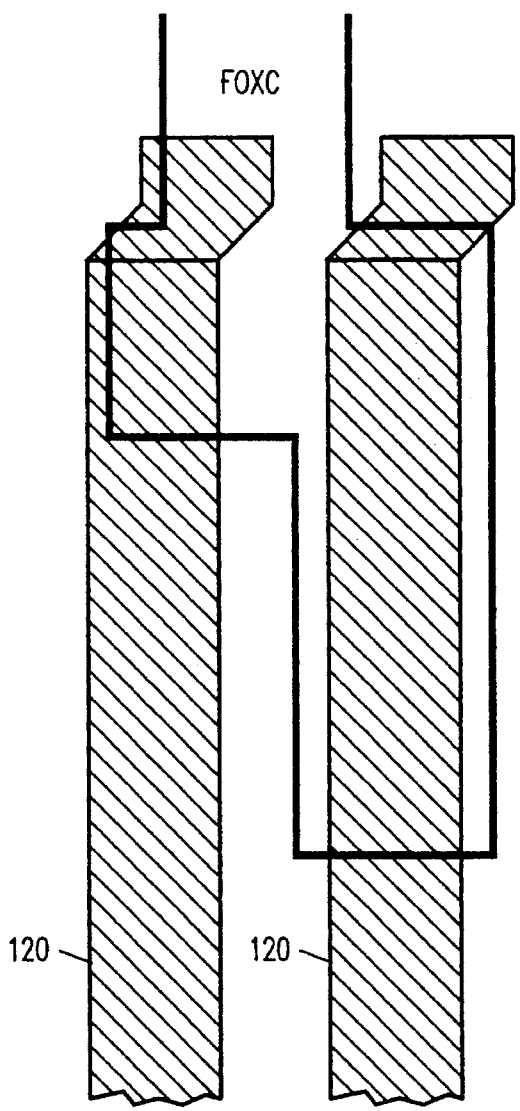
FIG. 12 is a plan diagram illustrating the angled portion of a pair of masked strips 120.

FIG. 12 shows a plan diagram that illustrates the angled portion of a pair of masked strips 120. Although the angled portions shown in FIG. 12 are parallel, the angled portions can also be different. Thus, in accordance with the concepts of the present invention, the right strip shown in FIG. 12 could be angled towards the left strip, or could have no angle at all, i.e., a zero degree angle.

Referring back to FIG. 9, after photoresist mask 116 has been formed, the unmasked layer of ONO 114 and underlying layer of poly1 112 are then plasma etched to form a plurality of pairs of spaced-apart, parallel strips 122 of ONO/poly1 which are connected together at the ends.

Thus, in accordance with the present invention and as shown in FIG. 9, by connecting together the ends of the strips 122 of ONO/poly1, the width of strips 122 at the edge of the field oxide regions FOXC will remain constant, even if photoresist mask 116 is slightly misaligned. As a result, the isolation between the to-be-formed bit lines will also remain constant.

Figure 13A:
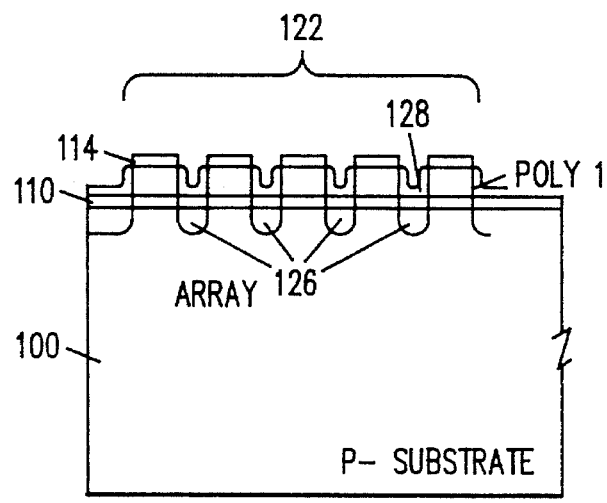
FIGS. 13A–13C are cross-sectional diagrams taken along lines 9A—9A, 9B—9B, and 9C—9C, respectively.
Figure 13B:
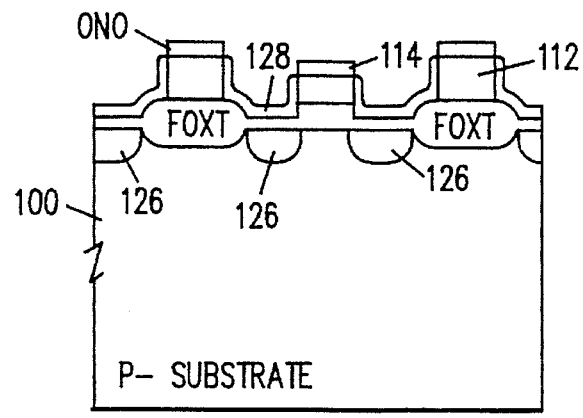
Figure 13C:
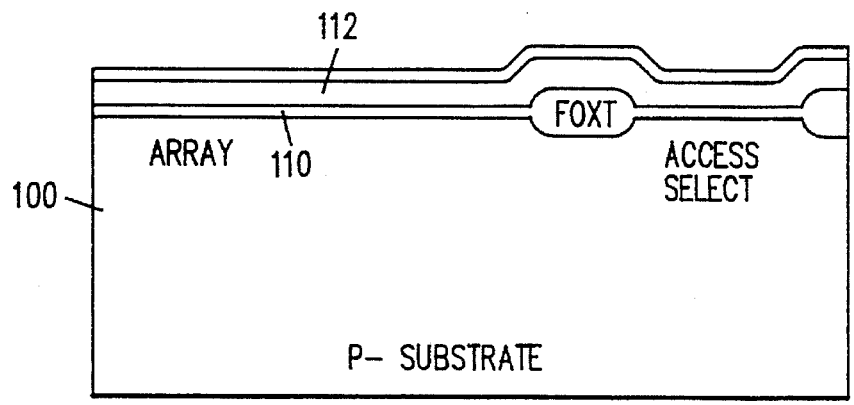

The next step is the formation of the bit lines of the array. FIGS. 13A–13C show cross-sectional diagrams taken along lines 9A—9A, 9B—9B, and 9C—9C, respectively. As shown in FIGS. 13A–13C, after the strips 122 of ONO/poly1 have been formed, arsenic is implanted into substrate 100 through the layer of oxide 124 to define the N+ bit lines 126. Following this, mask 116 is stripped.

Following this, a layer of differential oxide 128 is grown over the N+ bit lines 126. The layer of differential oxide 128 must be at least as thick as the layer of ONO 116 to avoid trenching of the substrate during a subsequent self aligned etch step which forms each of the cells and access transistors of the array.

At this point, a plurality of MOS transistors can be initially formed in the periphery. The typical AMG EPROM includes a number of MOS transistors that function, for example, as current sense detectors, amplifiers, and address decoders. To form the peripheral MOS devices, a protect array mask (not shown) is formed over the array and access regions of the substrate.

Following the formation of the protect array mask, the layer of ONO, the layer of poly1, and the layer of gate oxide are etched from the periphery. Once the layer of gate oxide has been removed, the protect array mask is stripped. Next, a second layer of gate oxide (not shown) approximately 200 Å thick is grown on the P-type semiconductor substrate in the periphery. After the layer of second gate oxide has been grown, the next step is to set the channel threshold voltages for each of the to be formed MOS transistors in the periphery. The threshold voltages are set by forming and patterning a threshold mask, and then implanting a P-type dopant through the unmasked layer of gate oxide. Following this, the threshold voltage mask is stripped.

Figure 14:
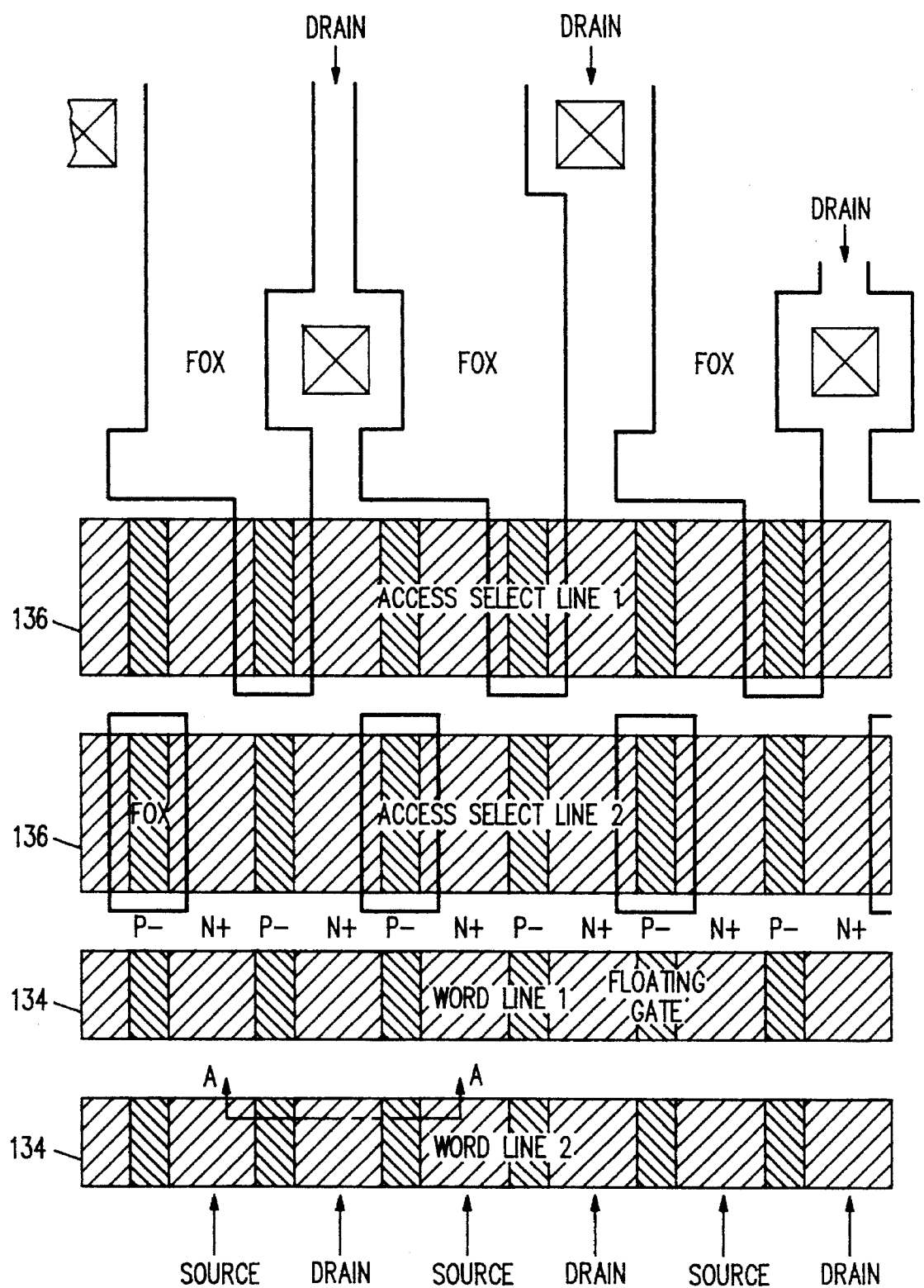
FIG. 14 is a plan view illustrating the formation of the word lines and access transistor lines.
Figure 15:
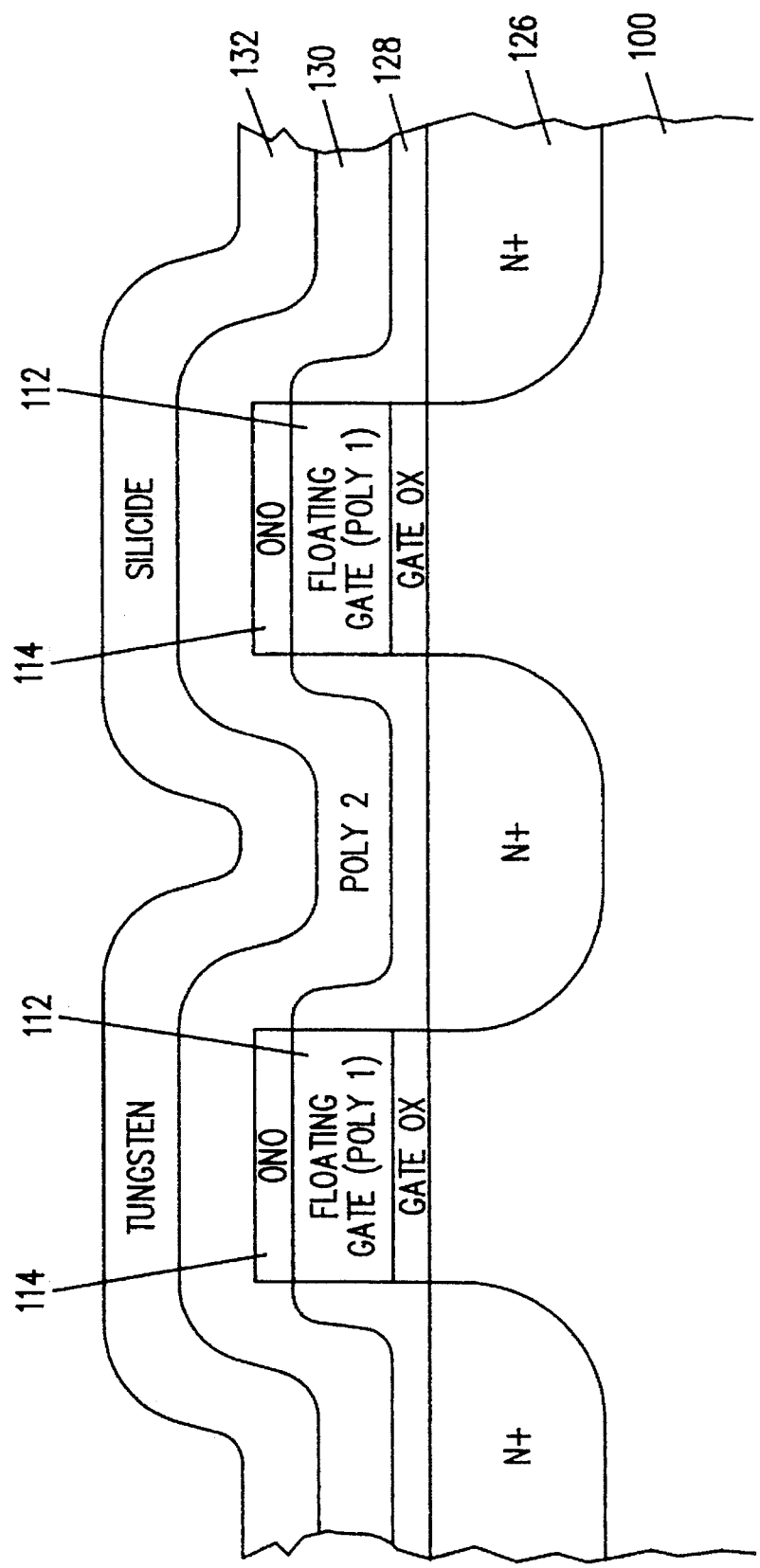
FIG. 15 is a cross-sectional view taken along lines 14A—14A.

Once the plurality of MOS transistors have been initially formed in the periphery, the next step is to form the word lines and access transistor lines in the array, and the gate electrodes of the MOS transistors in the periphery. FIG. 14 shows a plan view that illustrates the formation of the word lines and access transistor lines. FIG. 15 shows a cross-sectional view taken along lines 14A—14A.

Referring to FIG. 15, after the threshold voltages of the peripheral MOS devices have been set, a layer of second polysilicon (poly2) 130 approximately 1,500 Å is deposited over the surface of the entire device and doped in a conventional manner. In the preferred embodiment, this is followed by the deposition of an overlying layer of tungsten silicide 132 approximately 2,000 Å thick. As is well known, the control gates of the cells are formed by the portion of the composite layer of tungsten silicide/poly2 that is formed over the floating gates.

A word line mask (not shown) is then formed over the tungsten silicide/poly2 composite and patterned to define a series of word lines 134 and access select lines 136 in the array, and the gate electrodes of the peripheral MOS devices. Following this, the tungsten silicide/poly2 composite is etched until the unmasked layers of tungsten silicide, and poly2 have been removed. It is noted that the access transistors are EPROM cells which have a larger width than the array EPROM cells. This allows the access transistors to drive larger currents than the array cells.

After the tungsten silicide/poly2 composite has been etched, the word line mask is UV-hardened and a self-aligned etch (SAE) mask is formed so that the overlying tungsten silicide/poly2 composite can be used as a mask for a self-aligned etch of the ONO/poly1 composite. This then is followed by a stacked etch of the ONO/poly1 composite to define each of the memory cells and access transistors of the array.

After the self-aligned etch of the ONO/poly1 composite, the SAE mask is removed. Next, a source/drain mask (not shown) is formed and patterned to define the N+ source and drain regions of the MOS devices in the periphery. Once the source/drain mask has been formed, the P-type semiconductor substrate 100 underlying the unmasked areas is implanted with arsenic through the layer of gate oxide to a depth of 0.2 to 0.3 microns. The source/drain mask is then stripped. Following this, the process follows conventional steps.

Although the present invention has been described with respect to a conventional AMG EPROM, the present invention is also applicable to other AMG EPROMs which utilize similar fabrication steps, such as U.S. Pat. No. 5,246,874 for a METHOD OF MAKING FAST ACCESS AMG EMPROM, which is hereby incorporated by reference. In addition, one skilled in the art should recognize that the concepts of the present invention are equally applicable to AMG "flash" EPROMs which utilize similar fabrication processes, such as the EPROM described in U.S. application Ser. No. 07/988,293, filed by Albert Bergemont on Dec. 8, 1992, titled HIGH DENSITY CONTACTLESS FLASH EPROM ARRAY USING CHANNEL ERASE, or the EPROM described in U.S. application Ser. No. 830,938, filed by Albert Bergemont on Feb. 4, 1992, now U.S. Pat. No. 5,346,842, titled ALTERNATE METAL/SOURCE VIRTUAL GROUND FLASH CELL ARRAY, both of which are hereby incorporated by reference.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method for fabricating an alternate-metal, virtual-ground electrically programmable read-only-memory (EPROM) on a semiconductor substrate, the substrate having an array region and a pair of access select regions arranged so that the array region is formed between and adjoins the pair of access select regions, the method comprising the steps of:

forming a plurality of rows of spaced-apart field oxide regions in each access select region, the plurality of rows including a first row and a second row;

forming a layer of first dielectric material over the semiconductor substrate in the access select regions and the array region;

forming a layer of conductive material over the layer of first dielectric material and the field oxide regions in the access select regions, and over the layer of first dielectric material in the array region;

forming a layer of second dielectric material over the layer of conductive material in the access select regions and the array region;

defining a plurality of pairs of parallel, spaced-apart strips on the layer of second dielectric material that extend across the array region into both of the access select regions such that a first strip of each pair of strips is formed over a field oxide region in both the first and second rows of field oxide regions in one access select region, such that a second strip of each pair of strips is formed over a field oxide region in the second row of field oxide regions in said one access select region, and such that each pair of strips has ends which are connected together; and etching the second dielectric material and the layer of conductive material underlying the second dielectric material to form the plurality of pairs of parallel, spaced-apart strips.

2. The method of claim 1 wherein the layer of first dielectric material includes an oxide.

3. The method of claim 1 wherein the layer of conductive material includes polysilicon.

4. The method of claim 1 wherein the layer of second dielectric material includes a composite of oxide-nitride-oxide.

5. A method for fabricating an alternate-metal, virtual-ground electrically programmable read-only-memory (EPROM) on a semiconductor substrate, the substrate having an array region and a pair of access select regions arranged so that the array region is formed between and adjoins the pair of access select regions, the method comprising the steps of:

forming a plurality of rows of spaced-apart field oxide regions in each access select region, the plurality of rows including a first row and a second row;

forming a layer of first dielectric material over the semiconductor substrate in the access select regions and the array region;

forming a layer of first conductive material over the layer of first dielectric material and the field oxide regions in the access select regions, and over the layer of first dielectric material in the array region;

forming a layer of second dielectric material over the layer of first conductive material in the access select regions and the array region;

defining a plurality of parallel, spaced-apart strips on the layer of second dielectric material that extend across the array region into both of the access select regions such that first alternating strips are formed over a field oxide region in both the first row and the second row of field oxide regions in one access select region, and such that second alternating strips are formed over a field oxide region in the second row of field oxide regions in said one access select region, each strip having an angled portion formed over the field oxide region in the second row; and etching the second dielectric material and the layer of first conductive material underlying the second dielectric material to form the plurality of parallel, spaced-apart strips.

6. The method of claim 5 and further comprising the steps of:

forming a layer of third dielectric material over the layer of first dielectric material and the and the field oxide regions between the parallel, spaced-apart strips;

forming a layer of second conductive material over the layer of third dielectric material and the plurality of parallel, spaced-apart strips;

defining a plurality of word lines; and etching the layer of second conductive material, the second dielectric material and the layer of first conductive material underlying the second dielectric material to form the plurality of word lines, whereby the angled portions formed over the field oxide regions in the second row of field oxide regions are removed.

7. The method of claim 6 wherein the layer of conductive material includes polysilicon.

8. The method of claim 6 wherein the layer of second dielectric material includes a composite of oxide-nitride-oxide.

9. A method for fabricating an electrically programmable read-only-memory (EPROM) on a semiconductor substrate comprising the steps of:

forming a plurality of spaced-apart field oxide regions in the semiconductor substrate;

forming a layer of first dielectric material over the semiconductor substrate;

forming a layer of conductive material over the layer of first dielectric material and the field oxide regions;

forming a layer of second dielectric material over the layer of conductive material;

defining a plurality of unmasked, spaced-apart parallel strips, and a plurality of pairs of masked, spaced-apart parallel strips on the layer of second dielectric material, each pair of masked strips having ends which are connected together over a field oxide region; and etching away the unmasked strips of second dielectric material and the layer of conductive material underlying the unmasked strips of second dielectric material to form a plurality of pairs of spaced-apart parallel strips of second dielectric material and underlying conductive material.

10. The method of claim 9 wherein the layer of first dielectric material includes an oxide.

11. The method of claim 9 wherein the layer of conductive material includes polysilicon.

12. The method of claim 9 wherein the layer of second dielectric material includes a composite of oxide-nitride-oxide.

13. The method of claim 6 wherein the layer of first dielectric material includes an oxide.

* * * * *

UNITED STATES PATENT AND TRADEMARK OFFICE
CERTIFICATE OF CORRECTION

PATENT NO. : 5,496,754
DATED : March 5, 1996
INVENTOR(S) : Albert M. Bergemont, et al.

It is certified that error appears in the above-indentified patent and that said Letters Patent is hereby corrected as shown below:

In col 8, line 32, please delete the second occurrence of "and the".

Signed and Sealed this

Fourth Day of June, 1996

Attest:

BRUCE LEHMAN

*Attesting Officer*   *Commissioner of Patents and Trademarks*